United States Patent
Adegawa

(10) Patent No.: US 8,216,647 B2
(45) Date of Patent: Jul. 10, 2012

(54) INSULATING FILM, PROCESS FOR PRODUCING THE SAME AND ELECTRONIC DEVICE USING THE SAME

(75) Inventor: Yutaka Adegawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/914,471

(22) Filed: Oct. 28, 2010

(65) Prior Publication Data

US 2011/0039037 A1    Feb. 17, 2011

Related U.S. Application Data

(62) Division of application No. 11/374,164, filed on Mar. 14, 2006, now abandoned.

(30) Foreign Application Priority Data

Mar. 14, 2005 (JP) .................................. 2005-071073

(51) Int. Cl.
*H01L 21/31* (2006.01)

(52) U.S. Cl. ............ 427/508; 522/2; 522/150; 522/157; 522/158; 522/161; 522/79

(58) Field of Classification Search .............. 522/7, 150, 522/157–160, 2, 161, 79; 427/508
See application file for complete search history.

(56) References Cited

U.S. PATENT DOCUMENTS

| | | | |
|---|---|---|---|
| 5,017,734 A | 5/1991 | Baum et al. | |
| 6,509,415 B1 | 1/2003 | Lau et al. | |
| 6,858,700 B2 | 2/2005 | Dahl et al. | |
| 6,987,147 B2 * | 1/2006 | Lau et al. | 525/132 |
| 6,994,946 B2 * | 2/2006 | Hatakeyama et al. | 430/270.1 |
| 7,141,188 B2 * | 11/2006 | Li et al. | 252/570 |
| 7,141,692 B2 * | 11/2006 | Allen et al. | 556/460 |
| 7,261,992 B2 * | 8/2007 | Sooriyakumaran et al. | 430/270.1 |
| 7,307,137 B2 * | 12/2007 | Lau et al. | 528/86 |
| 7,309,752 B2 * | 12/2007 | Watanabe et al. | 526/282 |
| 7,501,185 B2 | 3/2009 | Watanabe et al. | |
| 7,534,292 B2 * | 5/2009 | Takahashi et al. | 106/285 |
| 7,569,649 B2 * | 8/2009 | Hiraoka | 526/282 |
| 2003/0143332 A1 | 7/2003 | Yoshida et al. | |
| 2003/0162002 A1 | 8/2003 | Lau et al. | |
| 2005/0090596 A1 | 4/2005 | Apen et al. | |
| 2005/0276964 A1 | 12/2005 | Watanabe et al. | |
| 2006/0204653 A1 * | 9/2006 | Adegawa | 427/99.2 |
| 2006/0205879 A1 * | 9/2006 | Adegawa et al. | 525/132 |
| 2006/0219987 A1 * | 10/2006 | Asano et al. | 252/510 |
| 2008/0076850 A1 * | 3/2008 | Asano | 522/172 |
| 2008/0081131 A1 * | 4/2008 | Muramatsu | 427/596 |

FOREIGN PATENT DOCUMENTS

| | | |
|---|---|---|
| JP | 2003273099 A | 9/2003 |
| WO | 03057755 A1 | 7/2003 |

OTHER PUBLICATIONS

Japanese Patent Office, "Notification of Reasons for Refusal," issued in connection with Japanese Patent Application No. 2005-071073, dated Jun. 4, 2008.

* cited by examiner

*Primary Examiner* — Susan W Berman
(74) *Attorney, Agent, or Firm* — Sughrue Mion, PLLC

(57) ABSTRACT

An insulating film formed by a method comprising: coating a film-forming composition containing a compound having a cage structure; and drying the coated composition, wherein the coated composition is irradiated with a light having a wavelength of 200 nm or less in at least one of during the drying and after the drying; a process for producing the same; and an electronic device having the same.

9 Claims, No Drawings

INSULATING FILM, PROCESS FOR PRODUCING THE SAME AND ELECTRONIC DEVICE USING THE SAME

This is a divisional of U.S. patent application Ser. No. 11/374,164, filed on Mar. 14, 2006, which claims the benefit of Japanese Patent Application No. 2005-071073, filed on Mar. 14, 2005. The entire disclosures of the prior applications are hereby incorporated by reference.

BACKGROUND OF THE INVENTION

1. Field of the Invention

The present invention relates to an insulating film, and more precisely, to an insulating film having good film properties such as a good dielectric constant and good mechanical properties, to a process for forming the insulating film and to an electronic device having the insulating film.

2. Description of the Related Art

In recent years, accompanied by the progress of high integration, multifunction and high performance in the field of electronic materials, circuit resistance and condenser capacity between wirings have been increased thus causing increase of electric power consumption and delay time. Particularly, increase of delay time becomes a large factor for the reduction of signal speed of devices and generation of crosstalk, so that reduction of parasitic resistance and parasitic capacity are in demand for the purpose of attaining acceleration of devices by reducing this delay time. As one of the concrete measures for reducing this parasitic capacity, an attempt has been made to cover periphery of wiring with a low dielectric layer insulating film. Also, the layer insulating film is expected to have superior heat resistance which can withstand the thin film formation step at the time of mounting substrate production and chip connection, pin attachment and the like post steps and also chemical resistance that can withstand wet process. In addition, a low resistance Cu wiring has been introduced in recent years instead of the Al wiring, and accompanied by this, flattening by CMP (chemical mechanical polishing) is commonly carried out, so that high mechanical strength which can withstand this process is in demand.

Polybenzoxazole and polyimide are widely known for insulating films of good heat resistance. However, since they contain a nitrogen atom of high polarity, they could not form films that are satisfactory in point of the necessary low level of dielectric constant, the water absorption resistance, the durability and the hydrolysis resistance.

In general, many organic polymers are poorly soluble in organic solvent, and a technique of preventing polymer deposition in coating solutions and preventing depositions in insulating films is an important theme in the art. To solve the problems, when the polymers are so modified that their main chain has a folded structure in order to have an increased solubility, then their glass transition point lowers and their heat resistance also lowers, and after all, it is not easy to obtain polymers that satisfy both the intended properties and the solubility.

Also, there has been known a highly heat-resistant resin having a backbone structure (main chain) of polyarylene ether (U.S. Pat. No. 6,509,415) which has a dielectric constant in the range of from 2.6 to 2.7. However, it is desired to further lower the dielectric constant of the resin for realizing high-speed devices. It is also desired not to make a film porous but to make the film have a bulk specific dielectric constant of 2.6 or less, more preferably 2.5 or less.

SUMMARY OF THE INVENTION

The present invention relates to an insulating film (also referred to as a "dielectric film" and a "dielectric insulating film", and these terms are not substantially distinguished) for solving the above-mentioned problems, and more particularly, to an insulating film having good film properties such as a good dielectric constant and good mechanical properties, to a process for forming the insulating film and to an electronic device having the insulating film.

The present inventors have found that the above-mentioned problems can be solved by the constitutions mentioned below.

(1) An insulating film formed by a method comprising:
coating a film-forming composition containing a compound having a cage structure; and
drying the coated composition,
wherein the coated composition is irradiated with a light having a wavelength of 200 nm or less in at least one of during the drying and after the drying.

(2) The insulating film as described in (1) above,
wherein the cage structure is a saturated hydrocarbon structure.

(3) The insulating film as described in (1) or (2) above,
wherein a ratio of all carbon atoms of the cage structure to all carbon atoms of a total solid content of the film-forming composition is 30% or more.

(4) The insulating film as described in any of (1) to (3) above,
wherein the cage structure is a diamantane structure.

(5) The insulating film as described in (4) above,
wherein the compound having a cage structure is a polymer of at least one compound represented by formula (I):

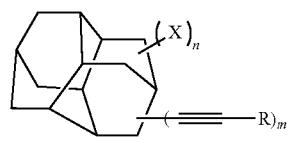

Formula (I)

wherein R represents a hydrogen atom, an alkyl group containing from 1 to 10 carbon atoms, an alkenyl group containing from 2 to 10 carbon atoms, an alkynyl group containing from 2 to 10 carbon atoms, an aryl group containing from 6 to 20 carbon atoms or a silyl group containing from 0 to 20 carbon atoms, and when a plurality of R's exist, they may be the same or different from each other;

m represents an integer of from 1 to 14;

X represents a halogen atom, an alkyl group containing from 1 to 10 carbon atoms, an alkenyl group containing from 2 to 10 carbon atoms, an aryl group containing from 6 to 20 carbon atoms or a silyl group containing from 0 to 20 carbon atoms, and when a plurality of X's exist, they may be the same or different from each other; and n represents an integer of from 0 to 13.

(6) The insulating film as described in any of (1) to (5) above,
wherein the compound having a cage structure is a compound that does not contain a nitrogen atom.

(7) The insulating film as described in any of (1) to (6) above,
wherein the film-forming composition contains an organic solvent.

(8) A process for producing an insulating film as described in any of (1) to (7) above, the process comprising:
a step of coating a film-forming composition containing a compound having a cage structure; and
a step of drying the coated composition, wherein the coated composition is irradiated with a light having a wavelength of 200 nm or less in at least one of during the drying and after the drying.

(9) An electronic device comprising an insulating film as described in any of (1) to (7) above.

DETAILED DESCRIPTION OF THE INVENTION

The invention will be described in detail below.

<Compound Having a Cage Structure>

The "cage structure" as referred to herein is meant to indicate a molecule in which the plural rings formed of covalent-bonded atoms define the capacity of the structure and in which all points existing inside the capacity could not leave the capacity without passing through the rings. For example, an adamantane structure may be considered as the cage structure. Contrary to this, a single crosslink-having cyclic structure such as norbornane (bicyclo[2,2,1]heptane) could not be considered as the cage structure since the ring of the single-crosslinked cyclic compound does not define the capacity of the compound.

The number of all carbon atoms of the cage structure in the invention is preferably from 10 to 30, more preferably from 11 to 18, particularly preferably 14.

The carbon atoms that constitute the cage structure do not include the carbon atoms of the linking group and the substituent bonding to the cage structure. For example, the cage structure of 1-methyladamantane is composed of 10 carbon atoms, and the cage structure of 1-ethyldiamantane is composed of 14 carbon atoms.

Preferably, the compound having the cage structure in the invention is a saturated hydrocarbon. Preferred examples of the cage structure are diamond-like adamantanes, diamantanes, triamantanes, tetramantanes and dodecahedranes as having good heat resistance. Of those, diamantanes and triamantanes are preferred as having a lower dielectric constant; and diamantanes are particularly preferred as easy to synthesize.

The cage structure in the invention may have one or more substituents, and examples of the substituent include a halogen atom (a fluorine atom, a chlorine atom, a bromine atom or an iodine atom), a straight-chained, branched or cyclic alkyl group containing from 1 to 10 carbon atoms (e.g., methyl, t-butyl, cyclopentyl or cyclohexyl), an alkenyl group containing from 2 to 10 carbon atoms (e.g., vinyl or propenyl), an alkynyl group containing from 2 to 10 carbon atoms (e.g., ethynyl or phenylethynyl), an aryl group containing from 6 to 20 carbon atoms (e.g., phenyl, 1-naphthyl or 2-naphthyl), an acyl group containing from 2 to 10 carbon atoms (e.g., benzoyl), an aryloxy group containing from 6 to 20 carbon atoms (e.g., phenoxy), an arylsulfonyl group containing from 6 to 20 carbon atoms (e.g., phenylsulofonyl), a nitro group, a cyano group, and a silyl group (e.g., triethoxysilyl, methyldiethoxysilyl or trivinylsilyl). Of these, a fluorine atom, a bromine atom, a straight-chained, branched or cyclic alkyl group containing from 1 to 5 carbon atoms, an alkenyl group containing from 2 to 5 carbon atoms, an alkynyl group containing from 2 to 5 carbon atoms and a silyl group are preferred substituents.

These substituents may further be substituted by other substituent.

Preferably, the cage structure in the invention has one to four substituent(s), more preferably two or three substituents, still more preferably two substituents. The substituent bonding to the cage structure may be a mono- or more poly-valent substituent or a di- or more poly-valent linking group.

The "compound having a cage structure" to be used in the invention may be either a low molecular weight compound or a high molecular weight compound (e.g., a polymer), but preferred is a polymer. When the compound having a cage structure is a polymer, its weight average molecular weight is preferably from 1,000 to 500,000, more preferably from 5,000 to 300,000, particularly preferably from 10,000 to 200,000. The polymer having a cage structure may be contained in a film-forming composition as a resin composition having a molecular weight distribution. When the compound having a cage structure is a low molecular weight compound, its molecular weight is preferably 3,000 or less, more preferably 2,000 or less, particularly preferably 1,000 or less.

The cage structure in the invention may be incorporated into a polymer principal chain as a mono- or more poly-valent pendant group. As a desirable polymer principal chain to which a cage structure is bonded, there are illustrated conjugated linking chains such as poly(arylene), poly(arylene ether), poly(ether) and polyacetylene, and polyethylene. Of these, poly(arylene ether) and polyacetylene are particularly desirable with respect to a good heat resistance.

It is particularly desirable that the cage structure of the invention forms a part of a polymer principal chain when the compound having a cage structure is a polymer. That is, when it forms a part of a polymer principal chain, it means that polymer chain is cut off when the cage structure is removed from this polymer. In this embodiment, the cage structure is directly single-bonded or connected by an appropriate divalent connecting group. Examples of the connecting group include —C($R_{11}$)($R_{12}$)—, —C($R_{13}$)=C($R_{14}$)—, arylene group, —CO—, —O—, —SO$_2$—, —N($R_{15}$)—, —Si($R_{16}$)($R_{17}$)— and a group as a combination thereof. In this case, $R_{11}$ to $R_{17}$ each independently represents a hydrogen atom, an alkyl group, an alkenyl group, an alkynyl group, an aryl group or an alkoxy group. These connecting groups may be substituted with a substituting group, and for example, the aforementioned substituting groups can be cited as preferred examples.

More preferred connecting groups among them is —C($R_{11}$)($R_{12}$)—, —CH=CH—, —C≡C—, an arylene group, —O—, —Si($R_{16}$)($R_{17}$)— or a group as a combination thereof, and particularly preferred is —CH=CH—, —C≡C—, —O—, —Si($R_{16}$)($R_{17}$)— or a group as a combination thereof.

The "compound having a cage structure" to be used in the invention may contain one or two or more species of the cage structures in the molecule of the compound.

Specific examples of the compound having a cage structure are shown below, to which, however, the invention is not limited.

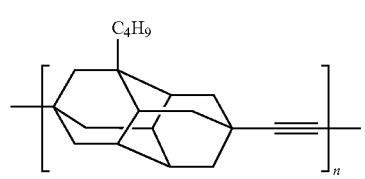

(A-1)

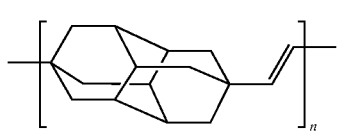

(A-2)

-continued
(A-3)
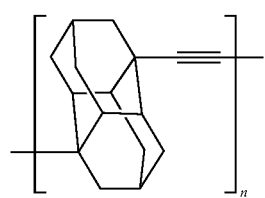
(A-4)
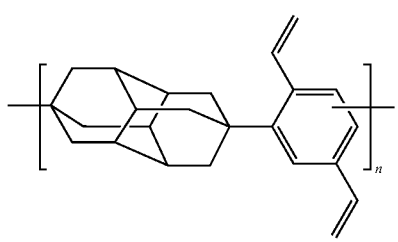
(A-5)
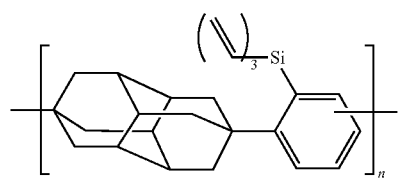
(A-6)
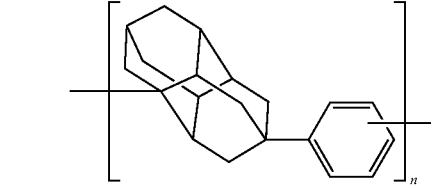
(A-7)
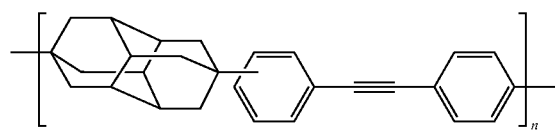
(A-8)
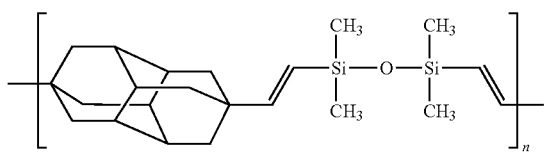
(A-9)
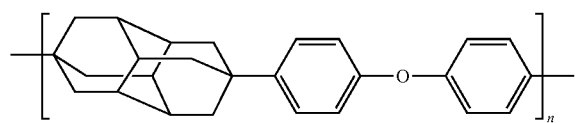
(A-10)
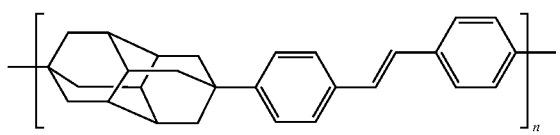
(A-11)
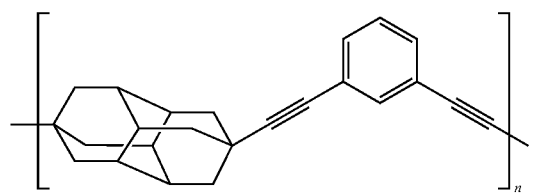
(A-12)
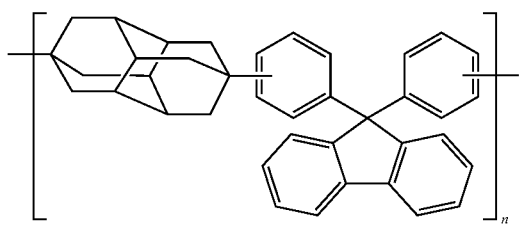
(A-13)
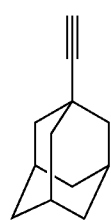
(A-14)
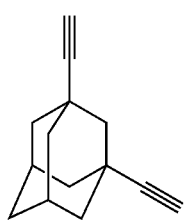
(A-15)
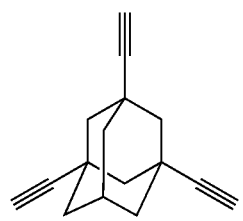
(A-16)
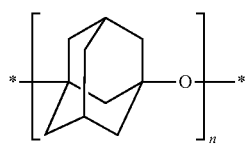

-continued
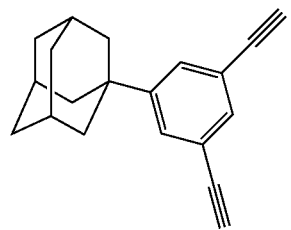
(A-17)
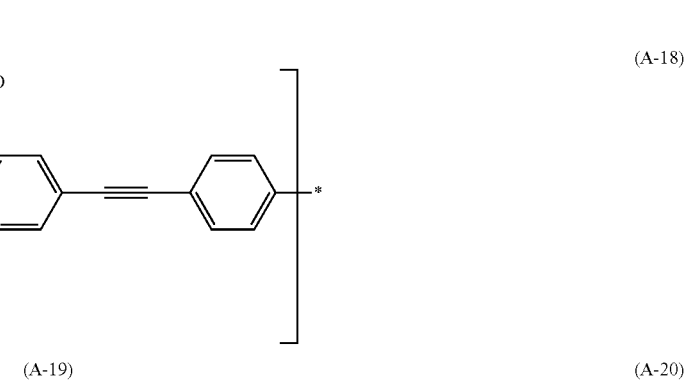
(A-18)
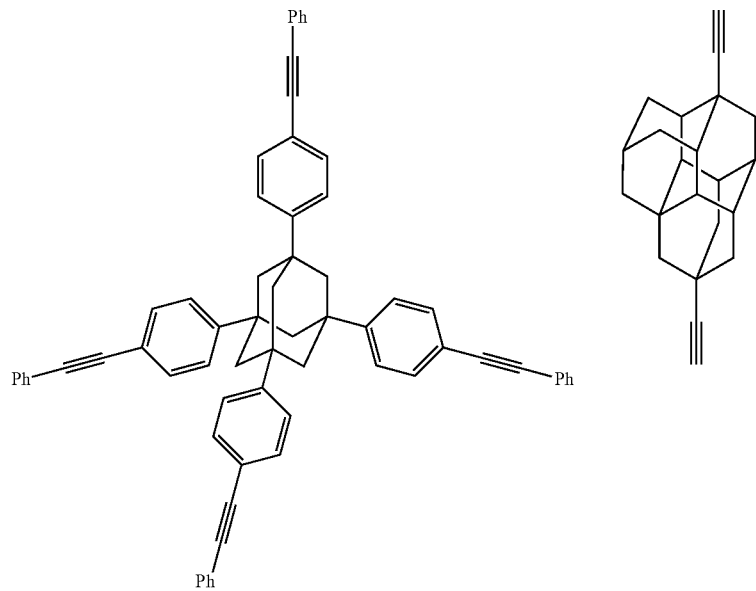
(A-19)
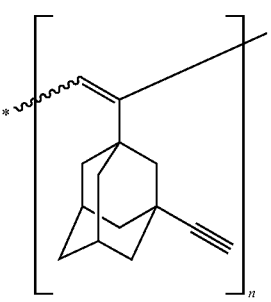
(A-20)
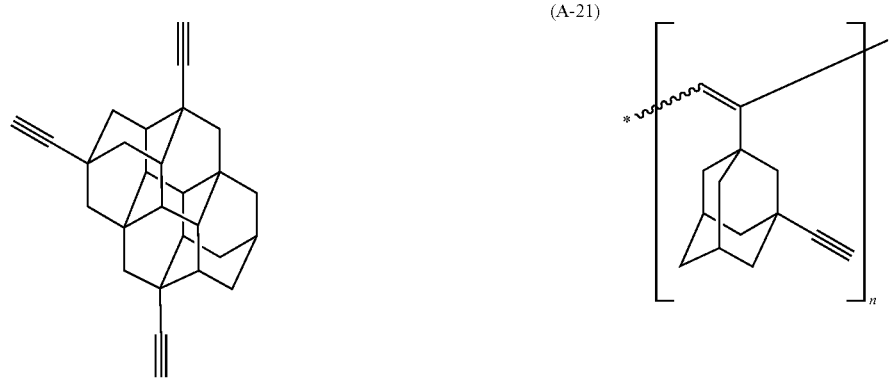
(A-21)
(A-22)

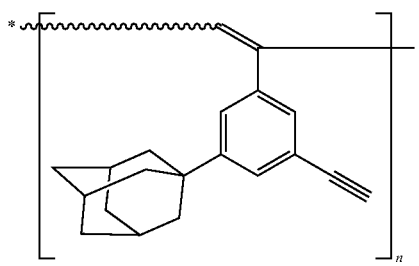

(A-23)

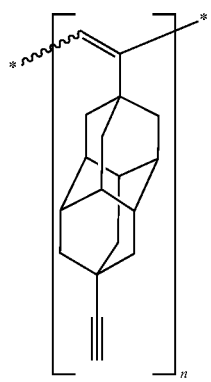

(A-24)

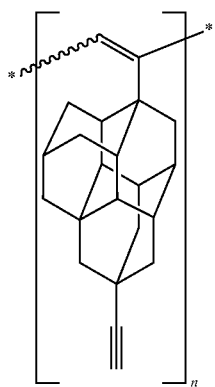

(A-25)

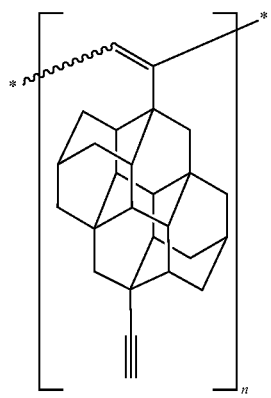

(A-26)

Especially preferably, the compound having a cage structure is a polymer of a compound of the following formula (I):

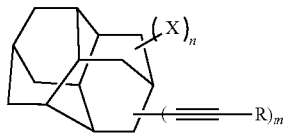

Formula (I)

In the formula (I),

R represents a hydrogen atom, an alkyl group containing from 1 to 10 carbon atoms, an alkenyl group containing from 2 to 10 carbon atoms, an alkynyl group containing from 2 to 10 carbon atoms, an aryl group containing from 6 to 20 carbon atoms or a silyl group containing from 0 to 20 carbon atoms, and when a plurality of R's exist, they may be the same or different from each other. When R does not represent a hydrogen atom, R may further be substituted by other substituent. Examples of such further substituent include a halogen atom (a fluorine atom, a chlorine atom, a bromine atom or an iodine atom), an alkyl group, an alkenyl group, an alkynyl group, an aryl group, an acyl group, an aryloxy group, an arylsulfonyl group, a nitro group, a cyano group and a silyl group. R preferably represents a hydrogen atom, an alkyl group containing from 1 to 10 carbon atoms, an aryl group containing from 6 to 20 carbon atoms or a silyl group containing from 0 to 20 carbon atoms, more preferably represents a hydrogen atom or a silyl group containing from 0 to 10 carbon atoms.

m represents an integer of from 1 to 14, preferably from 1 to 4, more preferably from 1 to 3, particularly preferably 2 or 3.

X represents a halogen atom, an alkyl group containing from 1 to 10 carbon atoms, an alkenyl group containing from 2 to 10 carbon atoms, an aryl group containing from 6 to 20 carbon atoms or a silyl group containing from 0 to 20 carbon atoms, and when a plurality of X's exist, they may be the same or different from each other, and X may further be substituted by other substituent. As examples of such substituent, there may be illustrated the same ones as have been illustrated with respect to R as further substituents. X preferably represents a fluorine atom, a chlorine atom, a bromine atom, an alkyl group containing from 1 to 10 carbon atoms, an alkenyl group containing from 2 to 10 carbon atoms or a silyl group containing from 0 to 20 carbon atoms, with a bromine atom, an alkenyl group containing from 2 to 4 carbon atoms or a silyl group containing from 0 to 10 carbon atoms being more preferred.

n represents an integer of from 0 to 13, preferably from 0 to 3, more preferably from 0 to 2, particularly preferably 0 or 1.

Polymerization of the compound represented by formula (I) is optimally conducted in an organic solvent at an inside temperature of preferably from 0° C. to 220° C., more preferably from 50° C. to 210° C., particularly preferably from 100° C. to 200° C. for a period of from 1 to hours, more preferably from 2 to 20 hours, particularly preferably from 3 to 10 hours. A metal catalyst such as palladium, nickel, tungsten or molybdenum may be used as needed.

The weight-average molecular weight of the polymer obtained by the polymerization is in the range of preferably from 1,000 to 500,000, more preferably from 5,000 to 300,000, particularly preferably from 10,000 to 200,000.

Specific examples of the compound represented by formula (I) are shown below.
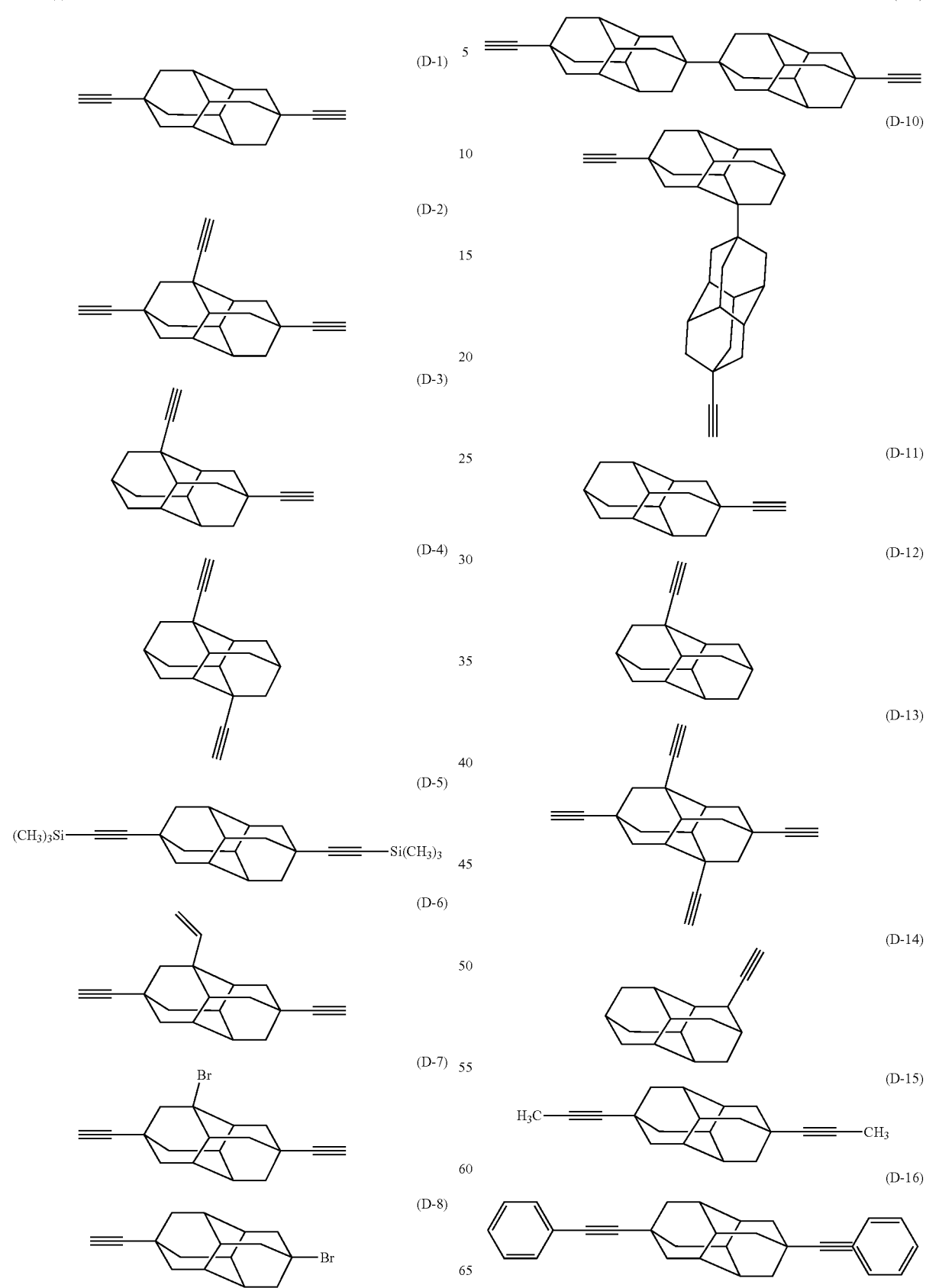

The compound having a cage structure preferably has a reactive group capable of forming a covalent bond with other molecule upon being heated. Such reactive group is not particularly limited but, for example, those substituents which cause a cyclization addition reaction or radical polymerization reaction can preferably be utilized. For example, a group having a double bond (e.g., a vinyl group or an allyl group), a group having a triple bond (e.g., an ethynyl group or a phenylethynyl group) and a combination of a diene group and a dienophile group for causing Diels-Alder reaction are effective, with an ethynyl group and a phenylethynyl group being particularly effective.

Also, in view of molar polarization ratio and dielectric constant influenced by hygroscopic properties of the insulating film, the compound of the invention having a cage structure preferably does not contain nitrogen atom. The compound of the invention having a cage structure is preferably a compound other than polyimide, i.e., a compound which does not have polyimide bond and amide bond.

In view of imparting good properties (dielectric constant and mechanical strength) to the insulating film formed from the composition for use in the invention, the ratio of all carbon atoms of the cage structure to all carbon atoms of the total solid content of the film-forming composition is preferably 30% or more, more preferably from 50 to 95%, still more preferably from 60% to 90%. Here, the total solid content of the film-forming composition corresponds to the total solid content constituting the insulating film obtained from this coating solution. Additionally, those which will not remain after formation of the insulating film such as a blowing agent are not included in the solid content.

As the compound having a cage structure, commercially available ones may be used, and those which are synthesized by known methods can also be utilized.

The film-forming composition for use in the invention may contain an organic solvent to use as a coated solution.

Suitable solvents which can be used in the invention are not particularly limited, and examples thereof include alcohol series solvents such as 1-methoxy-2-propanol, 1-butanol, 2-ethoxymethanol and 3-methoxypropanol; ketone series solvents such as acetylacetone, methyl ethyl ketone, methyl isobutyl ketone, 2-pentanone, 3-pentanone, 2-heptanone, 3-heptanone and cyclohexanone; ester series solvents such as propyl acetate, butyl acetate, isobutyl acetate, pentyl acetate, ethyl propionate, propyl propionate, butyl propionate, isobutyl propionate, propylene glycol monomethyl ether acetate, methyl lactate, ethyl lactate and γ-butyrolactone; ether series solvents such as isopropyl ether, dibutyl ether, ethyl propyl ether, anisole, phenetole and veratrol; and aromatic hydrocarbon series solvents such as mesitylene, ethylbenzene, diethylbenzene, propylbenzene and 1,2-dichlorobenzene. These may be used independently or in combination of two or more thereof.

More preferred solvents are 1-methoxy-2-propanol, cyclohexanone, propylene glycol monomethyl ether acetate, ethyl lactate, γ-butyrolactone, anisole and mesitylene.

The concentration of the solid content of the coating solution to be used in the invention is preferably from 0.1 to 20% by weight, more preferably from 0.1 to 10% by weight, particularly preferably from 0.1 to 5% by weight.

Further, to the film-forming composition for use in the invention may be added additives such as a radical generating agent, a nonionic surfactant, a fluorine-containing nonionic surfactant and a silane coupling agent within a range of not spoiling various properties (heat resistance, dielectric constant, mechanical strength, coating properties and adhesion properties) of the insulating film.

Examples of the radical generating agent include t-butyl peroxide, pentyl peroxide, hexyl peroxide, lauroyl peroxide, benzoyl peroxide, and azobisisobutyronitrile. Examples of the nonionic surfactant include octyl polyethylene oxide, decyl polyethylene oxide, dodecyl polyethylene oxide, octyl polypropylene oxide, decyl polypropylene oxide and dodecyl polypropylene oxide. Examples of the fluorine-containing nonionic surfactant include perfluorooctyl polyethylene oxide, perfluorodecyl polyethylene oxide and perfluorododecyl polyethylene oxide. Examples of the silane coupling agent include vinyltrimethoxysilane, vinyltriethoxysilane, vinyltriacetoxysilane, allyltrimethoxysilane, divinyldiethoxysilane, trivinylethoxysilane, and hydrolyzates and dehydration condensates thereof.

As to the addition amount of the additive, there exists a suitable range depending upon the use of the additive or the concentration of the solid content of the coating solution, but the addition amount is preferably from 0.001% to 10% by weight, more preferably from 0.01 to 5% by weight, particularly preferably from 0.05% to 2% by weight, based on the weight of the coating solution.

The insulating film can be formed by coating the coating solution for use in the invention on a substrate according to an arbitrary coating method such as a spin coating method, a roller coating method, a dip coating method or a scan coating method, then subjecting the coated substrate to a step of removing the solvent by heat-drying or non-heat-drying and a step of ripening the film by heating or the like.

In the case of employing heating, the former step is referred to as a heat-drying step, and the latter step is referred to as a baking step (or a heat-ripening step). Additionally, a step including heating to a temperature of 300° C. or higher is called a baking step, and the heat-drying step and the baking step can be conducted in an integrated manner. The case of practicing the heating in an integrated manner is included in the heat-drying step of the invention. The method for the heat treatment is not particularly limited, and a generally employed hot plate heating, a method of heating using a furnace or a method of irradiating with light using a xenon lamp in RTP (Rapid Thermal Processor) can be employed.

In the invention, irradiation with a light of 200 nm or less in wavelength is conducted upon (during) drying and/or after drying. The wavelength of a light to be irradiated is preferably 190 nm or less, more preferably 180 nm or less. The lower limit of the wavelength is not particularly limited but, in view of restrictions with respect to the cost of apparatus, the wavelength is preferably 150 nm or more.

Light of such wavelength can be emitted by preparing an appropriate light source. A light of from 165 nm to 200 nm in wavelength can be emitted by using a high-output heavy hydrogen lamp, and a light of 193 nm in wavelength can be emitted by using an ArF excimer laser or a full-solid laser. Also, a light of 157 nm in wavelength can be emitted by using an $F_2$ excimer laser. A preferred light of 172 nm in wavelength can be emitted by using a $Xe_2$ excimer lamp.

The irradiation energy is preferably from 10 $mJ/cm^2$ to 1,000 $mJ/cm^2$, more preferably from 20 $mJ/cm^2$ to 500 $mJ/cm^2$, still more preferably from 25 $mJ/cm^2$ to 500 $mJ/cm^2$.

The insulating film of the invention obtained by using the coating solution is suitable for insulation-coating film in electronic parts such as semiconductor devices, multi-chip module multilayered wiring boards, etc. Specifically, it is usable as interlayer insulating film for semiconductors, surface protective film, buffer coat film, as well as for passivation film in LSI, α-ray blocking film, cover lay film in flexographic plates, overcoat film, cover coat for flexible copper-lined plates, solder-resist film, and liquid-crystal alignment film, etc.

The thickness of the coated film is not particularly limited, but is preferably from 0.001 to 100 μm, more preferably from 0.01 to 10 mμ, particularly preferably from 0.1 to 0.3 μm.

It is also possible to form a porous film by previously adding a blowing agent to the coating solution for forming the insulating film of the invention. The blowing agent to be previously added for forming the porous film is not particularly limited, and examples thereof include organic compounds having a boiling point higher than that of the solvent of the coating solution, thermally decomposable low molecular compounds and thermally decomposable high molecular compounds.

As to the addition amount of the blowing agent, there exists a suitable range depending upon the concentration of the solid content of the coating solution but, in general, the addition amount is preferably from 0.01 to 20%, more preferably from 0.1% to 10%, particularly preferably from 0.5 to 5%, in terms of % by weight in the coating solution.

In the heat-ripening step of the invention, the heating temperature is preferably from 300 to 450° C., more preferably from 300 to 420° C., particularly preferably from 350 to 400° C., and the heating time is preferably from 1 minute to 2 hours, more preferably from 10 minutes to 1.5 hours, particularly preferably from 30 minutes to 1 hour. The heat-ripening step may be conducted in several steps.

EXAMPLES

The following Examples are to describe the invention but not to restrict the scope of the invention.

Structures of compounds used in Examples are shown below.

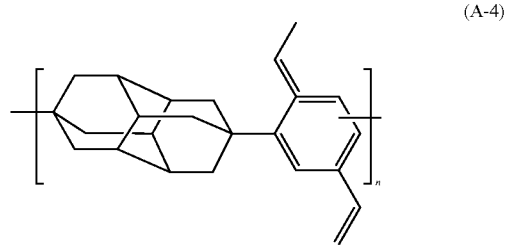

(A-4)

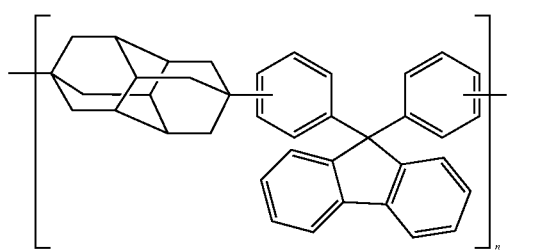

(A-12)

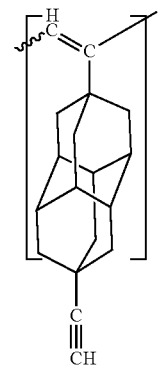

(A)

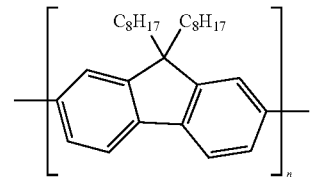

(B)

Synthesis Example 1

According to the method described in Macromolecules, 24, 5266 (1991), 4,9-dibromodiamantane was synthesized. Next, 1.30 g of commercially available p-divinylbenzene, 3.46 g of 4,9-dibromodiamantane, 200 ml of dichloroethane and 2.66 g of aluminum chloride were fed into a 500-ml flask, and stirred at an internal temperature of 70° C. for 24 hours. Thereafter, 200 ml of water was added to it, and the organic layer was separated through liquid-liquid separation. Anhydrous sodium sulfate was added thereto, and the solid content was removed through filtration. Then, this was concentrated under reduced pressure until dichloromethane was reduced to a half. 300 ml of methanol was added to the resulting solution, and the deposited solid was taken out through filtration. 2.8 g of a polymer (A-4) having a weight-average molecular weight of about 10,000 was thus obtained.

In the same manner, a polymer (A-12) having a weight-average molecular weight of about 10,000 was synthesized through Friedel-Crafts reaction.

Example 1

1.0 g of the above polymer (A-4) was dissolved in a mixed solvent of 10.0 ml of cyclohexanone and 10.0 ml of anisole under heating to prepare a coating solution. After filtration through a 0.1μ filter made of tetrafluoroethylene, this solution was spin coated on a silicon wafer, and the coated film was heat-dried on a hot plate at 150° C. for 60 seconds in a nitrogen stream. Then, baking (heat-ripening) was conducted for 5 minutes on a 350° C. hot plate in a nitrogen stream while irradiating with a light of 172 nm in wavelength in an energy amount of 100 mJ/cm² using a dielectric barrier discharge system excimer lamp, UER20-172, manufactured by USHIO DENKI. The specific dielectric constant of the thus-formed insulating film having a thickness of 0.15 μm was calculated from the capacitance value thereof measured at 1 MHz by the use of Four Dimensions' mercury probe and Yokogawa Hewlett Packard's HP4285ALCR meter, and it was 2.52. The Young's modulus of the film was measured by using MTS' nano-indenter SA2, and was found to be 7.0 GPa.

When the specific dielectric constant was measured after leaving this wafer for 1 week in an atmosphere of 23° C. and 40% RH, it was found to be 2.53.

Example 2

1.0 g of the above polymer (A-12) was dissolved under heat in a mixed solvent of 10.0 ml of gamma-butyrolactone and 10.0 ml of anisole to prepare a coating solution. The solution was filtered through a 0.1µ tetrafluoroethylene filter, and then applied onto a silicon wafer in a mode of spin coating. The coated film was heat-dried on a hot plate in a nitrogen stream. Further, heat-ripening was conducted for 2 minutes on a 300° C. hot plate while irradiating with a light of 172 nm in an energy amount of 70 mJ/cm$^2$ using UER20-172. The specific dielectric constant of the thus-formed insulating film having a thickness of 0.15 micron was 2.55. The Young's modulus of the film was 6.0 GPa.

When the specific dielectric constant was measured according to the above-mentioned method after leaving this wafer for 1 week in an atmosphere of 23° C. and 40% RH, it was found to be 2.56.

Synthesis Example 2

According to the method described in Macromolecules, 24, 5266 (1991), 4,9-diethynyldiamantane was synthesized using diamantine as a starting material. Next, 10 g of 4,9-diethynyldiamantane, 50 ml of 1,3,5-triisopropylbenzene and 120 mg of Pd(PPh$_3$)$_4$ were stirred at an internal temperature of 190° C. for 12 hours. After cooling the reaction solution to room temperature, 300 ml of isopropyl alcohol was added thereto. Solids thus precipitated were collected by filtration and then washed with methanol. Thus, there was obtained 3.0 g of a polymer (A) having a weight-average molecular weight of 20,000 was thus obtained.

Example 3

1.0 g of the polymer (A) synthesized in Synthesis Example 2 was dissolved in 20.0 ml of cyclohexanone to prepare a coating solution. The solution was filtered through a 0.2-micron tetrafluoroethylene filter, and then applied onto a silicon wafer in a mode of spin coating. The coated film was heat-dried on a hot plate in a nitrogen stream at 110° C. for 90 seconds while irradiating with a light of 172 nm in wavelength in an energy amount of 200 mJ/cm$^2$ using UER20-172, and then at 250° C. for 60 seconds. The coated film was further heat-ripened in a 400° C. oven purged with nitrogen gas for 15 minutes. The specific dielectric constant of the thus-formed insulating film having a thickness of 0.15 micron was 2.41. The Young's modulus of the film was 7.0 GPa.

When the specific dielectric constant was measured according to the above-mentioned method after leaving this wafer for 1 week in an atmosphere of 23° C. and 40% RH, it was found to be 2.41.

Comparative Example 1

A coating solution was prepared in the same manner as in Example 3. The solution was filtered through a 0.2-micron tetrafluoroethylene filter, and then applied onto a silicon wafer in a mode of spin coating. The coating film was heat-dried on a hot plate in a nitrogen stream at 110° C. for 90 seconds while irradiating with a light of 248 nm in an energy amount of 200 mJ/cm$^2$ using an ultra-high pressure mercury lamp manufactured by USHIO DENKI and a UV-cut filter, and then at 250° C. for 60 seconds. The coated film was further heat-ripened in a 400° C. oven purged with nitrogen gas for 60 minutes. The specific dielectric constant of the thus-formed insulating film having a thickness of 0.15 micron was 2.49. The Young's modulus of the film was 7.0 GPa.

When the specific dielectric constant was measured according to the above-mentioned method after leaving this wafer for 1 week in an atmosphere of 23° C. and 40% RH, it was found to be 2.64.

Comparative Example 2

1.0 g of polymer (B) (obtained from SIGMA-ALDRICH) was dissolved in 20.0 ml of cyclohexanone to prepare a coating solution. The solution was filtered through a 0.2-micron tetrafluoroethylene filter, and then applied onto a silicon wafer in a mode of spin coating. The coated film was heat-dried on a hot plate in a nitrogen stream at 110° C. for 90 seconds while irradiating with a light of 172 nm in wavelength using UER20-172, and then at 250° C. for 60 seconds. The oxygen concentration in the heat drying was 10 ppm at room temperature. The coated film was further heated in a 400° C. oven purged with nitrogen gas for 60 minutes. The specific dielectric constant of the thus-formed insulating film having a thickness of 0.15 micron was 2.70. The Young's modulus of the film was 3.5 GPa.

When the specific dielectric constant was measured according to the above-mentioned method after leaving this wafer for 1 week in an atmosphere of 23° C. and 40% RH, it was found to be 2.76.

The insulating film of the invention has good film properties such as dielectric constant and mechanical strength, with the dielectric constant being good with time. Therefore, the film can be utilized as an interlayer insulating film in an electronic device.

The entire disclosure of each and every foreign patent application from which the benefit of foreign priority has been claimed in the present application is incorporated herein by reference, as if fully set forth.

What is claimed is:
1. A process for producing an insulating film comprising:
   applying a film-forming composition containing a compound having a cage structure, so as to form an applied film-forming composition; and
   drying the applied film-forming composition,
   wherein the ratio of all carbon atoms of the cage structure to all carbon atoms of the total solid content of the film-forming composition is 30% or more, and the applied film-forming composition is irradiated with a light having a wavelength of 200 nm or less in at least one of during the drying and after the drying.
2. The process according to claim 1,
   wherein the cage structure is a saturated hydrocarbon structure.
3. The process according to claim 1,
   wherein the cage structure is a diamantane structure.
4. The process according to claim 1,
   wherein the compound having a cage structure is a compound that does not contain a nitrogen atom.
5. The process according to claim 1,
   wherein the film-forming composition contains an organic solvent.
6. The process according to claim 1,
   wherein the light source of the light having a wavelength of 200 nm or less is an excimer laser or an excimer lamp.

7. The process according to claim 6,
wherein the light source of the light having a wavelength of 200 nm or less is an ArF excimer laser.

8. The process according to claim 6,
wherein the light source of the light having a wavelength of 200 nm or less is a $Xe_2$ excimer lamp.

9. A process for producing an insulating film comprising:
applying a film-forming composition containing a compound having a cage structure, so as to form an applied film-forming composition; and
drying the applied film-forming composition,
wherein:
the applied film-forming composition is irradiated with a light having a wavelength of 200 nm or less in at least one of during the drying and after the drying;
the cage structure is a diamantane structure; and
the compound having a diamantane structure is a polymer of at least one compound represented by formula (I):

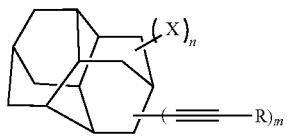

Formula (I)

wherein R represents a hydrogen atom, an alkyl group containing from 1 to 10 carbon atoms, an alkenyl group containing from 2 to 10 carbon atoms, an alkynyl group containing from 2 to 10 carbon atoms, an aryl group containing from 6 to 20 carbon atoms or a silyl group containing from 0 to 20 carbon atoms, and when a plurality of R's exist, they may be the same or different from each other;

m represents an integer of from 1 to 14;

X represents a halogen atom, an alkyl group containing from 1 to 10 carbon atoms, an alkenyl group containing from 2 to 10 carbon atoms, an aryl group containing from 6 to 20 carbon atoms or a silyl group containing from 0 to 20 carbon atoms, and when a plurality of X's exist, they may be the same or different from each other; and n represents an integer of from 0 to 13.

* * * * *